(12) United States Patent
Shibasaki et al.

(10) Patent No.: US 11,031,512 B2
(45) Date of Patent: Jun. 8, 2021

(54) SOLAR CELL, MULTIJUNCTION SOLAR CELL, SOLAR CELL MODULE, AND SOLAR POWER GENERATION SYSTEM

(71) Applicant: KABUSHIKI KAISHA TOSHIBA, Tokyo (JP)

(72) Inventors: Soichiro Shibasaki, Tokyo (JP); Miyuki Shiokawa, Kawasaki Kanagawa (JP); Naoyuki Nakagawa, Tokyo (JP); Kazushige Yamamoto, Yokohama Kanagawa (JP); Yuya Honishi, Yokohama Kanagawa (JP); Takeshi Niimoto, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 104 days.

(21) Appl. No.: 15/691,995

(22) Filed: Aug. 31, 2017

(65) Prior Publication Data
US 2018/0269341 A1 Sep. 20, 2018

(30) Foreign Application Priority Data

Mar. 17, 2017 (JP) .............................. JP2017-053463

(51) Int. Cl.
| | | |
|---|---|---|
| *H01L 31/0224* | (2006.01) | |
| *H01L 31/032* | (2006.01) | |
| *H01L 31/18* | (2006.01) | |
| *H01L 31/0749* | (2012.01) | |
| *H01L 31/0725* | (2012.01) | |

(52) U.S. Cl.
CPC ............... *H01L 31/022425* (2013.01); *H01L 31/022466* (2013.01); *H01L 31/0322* (2013.01); *H01L 31/0725* (2013.01); *H01L 31/0749* (2013.01); *H01L 31/1884* (2013.01); *Y02E 10/50* (2013.01); *Y02P 70/50* (2015.11)

(58) Field of Classification Search
None
See application file for complete search history.

(56) References Cited

U.S. PATENT DOCUMENTS

| 4,677,250 A | 6/1987 | Barnett et al. |
|---|---|---|
| 8,629,346 B2 | 1/2014 | Matsui et al. |

(Continued)

FOREIGN PATENT DOCUMENTS

| JP | 63-276278 | 11/1988 |
|---|---|---|
| JP | 7-044288 | 5/1995 |

(Continued)

OTHER PUBLICATIONS

KR20140080468, Machine Translation, Kim (Year: 2014).*

(Continued)

*Primary Examiner* — Devina Pillay

(74) *Attorney, Agent, or Firm* — Amin, Turocy & Watson, LLP

(57) ABSTRACT

A solar cell of an embodiment includes: a substrate having a light transmitting property; a first electrode including a plurality of metal portions and having a light transmitting property; a light absorbing layer disposed on the first electrode and absorbing light; and a second electrode disposed on the light absorbing layer and having a light transmitting property.

19 Claims, 6 Drawing Sheets

(56) References Cited

U.S. PATENT DOCUMENTS

| | | | |
|---|---|---|---|
| 2004/0226602 A1* | 11/2004 | Durr | H01G 9/2031 |
| | | | 136/256 |
| 2006/0162770 A1* | 7/2006 | Matsui | H01G 9/2031 |
| | | | 136/263 |
| 2006/0174936 A1* | 8/2006 | Di Palma | H01G 9/2009 |
| | | | 136/263 |
| 2010/0096011 A1* | 4/2010 | Griffiths | G02B 5/288 |
| | | | 136/257 |
| 2011/0175065 A1* | 7/2011 | de la Vega | H01L 31/1884 |
| | | | 257/40 |
| 2011/0220189 A1 | 9/2011 | Yamamuka et al. | |
| 2011/0272010 A1* | 11/2011 | Abou-Kandil | |
| | | | H01L 31/022483 |
| | | | 136/255 |
| 2011/0315190 A1 | 12/2011 | Yoshikawa et al. | |
| 2012/0204939 A1 | 8/2012 | Lee et al. | |
| 2013/0004753 A1* | 1/2013 | Majumdar | H01L 51/0024 |
| | | | 428/209 |
| 2013/0327928 A1* | 12/2013 | Leach | B82Y 20/00 |
| | | | 250/216 |
| 2014/0124023 A1 | 5/2014 | Kim | |
| 2014/0216543 A1 | 8/2014 | Sugimoto | |
| 2014/0238485 A1 | 8/2014 | Mizuno et al. | |
| 2015/0359109 A1 | 12/2015 | Hwang et al. | |
| 2016/0071655 A1* | 3/2016 | Li | H01G 9/2022 |
| | | | 136/254 |
| 2018/0083150 A1 | 3/2018 | Shibasaki et al. | |

FOREIGN PATENT DOCUMENTS

| | | | | |
|---|---|---|---|---|
| JP | 09-172193 | 6/1997 | | |
| JP | 2000-285977 | 10/2000 | | |
| JP | 2005-197597 | 7/2005 | | |
| JP | 2015-536023 | 12/2005 | | |
| JP | 2012-069803 | 4/2012 | | |
| JP | 2012-094748 | 5/2012 | | |
| JP | 5116869 | 10/2012 | | |
| JP | 2013-055178 | 3/2013 | | |
| JP | 2013-098195 | 5/2013 | | |
| JP | 2013-201187 | 10/2013 | | |
| JP | 2013-222688 | 10/2013 | | |
| JP | 2014-096587 | 5/2014 | | |
| JP | 5875124 | 1/2016 | | |
| JP | 2018-56541 | 4/2018 | | |
| KR | 2014-0080468 | 6/2014 | | |
| KR | 20140080468 | * | 6/2014 | H01L 31/076 |
| WO | 2009/038083 | 3/2009 | | |
| WO | 2010/101030 | 9/2010 | | |

OTHER PUBLICATIONS

Nakada, et al., "Cu(In1-x, Gax)Se2-Based Thin Film Solar Cells Using Transparent Conducting Back Contacts", Japan Journal Applied Physics, vol. 41 (2002) pp. L1209-L1211.

* cited by examiner

SOLAR CELL, MULTIJUNCTION SOLAR CELL, SOLAR CELL MODULE, AND SOLAR POWER GENERATION SYSTEM

CROSS-REFERENCE TO RELATED APPLICATION

This application is based upon and claims the benefit of priority from Japanese Patent Application No. 2017-053463, filed on Mar. 17, 2017; the entire contents of which are incorporated herein by reference.

FIELD

Embodiments described herein relate to a solar cell, a multijunction solar cell, a solar cell module, and a solar power generation system.

BACKGROUND

There is a multijunction (tandem) solar cell. A cell with a high efficiency can be used for each wavelength band, and therefore a higher conversion efficiency than a single junction cell is expected. It is known that a chalcopyrite solar cell using a compound semiconductor generated using four kinds of elements of copper (Cu), indium (In), gallium (Ga), and selenium (Se) as a raw material has a better conversion efficiency than other solar cells, and the chalcopyrite solar cell can be a top cell candidate by making a gap wide. However, in a case of use as a top cell, it is necessary to use a transparent electrode in order to transmit light having a band gap or less. If a light absorbing layer is formed directly on the transparent electrode, an interface is oxidized, and a good contact cannot be formed, thereby lowering a conversion efficiency.

DETAILED DESCRIPTION

Figure 1:
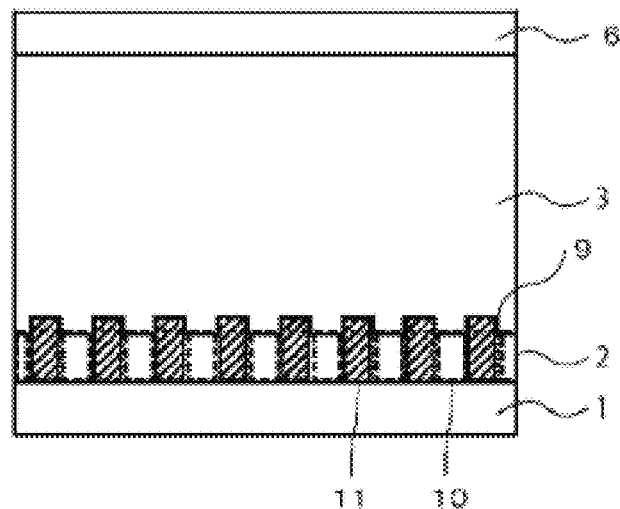
FIG. 1 is a cross-sectional conceptual view of a solar cell according to an embodiment.

Hereinafter, embodiments of the present invention will be described in detail with reference to the drawings.

First Embodiment

A first embodiment will be described with reference to FIG. 1. A solar cell 100 according to the present embodiment includes a substrate 1 containing an alkali metal transmitting light and a first electrode 2 disposed on the substrate 1. The solar cell 100 includes a light absorbing layer 3 on the first electrode 2. In addition, the second electrode 6 is present on the light absorbing layer 3. The light absorbing layer 3 supplies electrons to the second electrode 6 due to light incident on the light absorbing layer 3 from above the second electrode. The first electrode 2 includes a non-light transmitting portion 11 having metal portions (conductive portions) 9 for diffusing the alkali metal into the light absorbing layer 3. The non-light transmitting portion 11 faces the substrate 1. The first electrode 2 further includes a light transmitting portion 10 containing a material transmitting light incident on the light transmitting portion 10 from the light absorbing layer 3 adjacent to the non-light transmitting portion 11. The non-light transmitting portion means a portion having no light transmitting property or a portion having substantially no light transmitting property, and the light transmitting property means a property capable of transmitting light.

Herein, "facing" here means facing each other, and facing may be performed in contact with each other or may be performed with another constituent element interposed therebetween. In addition, "upper" and "lower" indicate upper or lower in a direction (lamination direction) from the substrate 1 toward the second electrode 6 with the shortest distance.

In the embodiment of FIG. 1, each of the metal portions 9 is formed from a surface on a side of the substrate 1 up to a surface of the first electrode 2 on a side of the light absorbing layer 3, and as a result, each of the metal portions 9 is in direct contact with both the substrate 1 and the light absorbing layer 3. Each of the metal portions 9 is only required to be in direct contact with the substrate 1. For example, as illustrated in FIG. 1, each of the metal portions 9 may be formed from a surface on a side of the substrate 1 up to an inside of the light absorbing layer 3. The structure in which each of the metal portions 9 is formed up to the inside of the light absorbing layer 3 is, for example, a structure in which a plurality of grooves are present on a surface of the light absorbing layer 3 facing the first electrode 2, and the metal portions 9 are also present in the plurality of grooves. In addition, in a case where an effect of the present embodiment is obtained, each of the metal portions 9 may be formed up to an inside of the first electrode 2 without being formed up to a surface of the first electrode 2 on a side of the light absorbing layer 3.

(Substrate)

The substrate 1 according to the embodiment is a substrate containing an alkali metal and having a light transmitting property. Light incident on the substrate 1 from the light absorbing layer 3 passes through the substrate 1. For example, soda-lime glass is desirably used, and general glass such as quartz, white sheet glass, or chemically reinforced glass, or a resin such as polyimide or an acrylic resin can also be used.

A glass substrate contains sodium and potassium, and therefore diffusion from the substrate into a light absorbing layer is expected. However, in a case of a small content of sodium and potassium in glass or in a case of use of quartz or another substrate, desirably, a material containing sodium and potassium (for example, a fluoride) is vapor-deposited or a film of the material is formed on a substrate in advance.

(First Electrode)

The first electrode 2 in the embodiment is an area including the light transmitting portion 10 having a light transmitting property and a non-light transmitting portion 11 having a plurality of metal portions 9 formed therein and having no light transmitting property, being present between the substrate 1 and the light absorbing layer 3, and having an aperture ratio of 50% or more. The aperture ratio is a ratio of an area of the light transmitting portion 10 to a total area of the light transmitting portion 10 and the non-light transmitting portion 11 on a surface of the first electrode 2 on a side of the light absorbing layer. The light transmitting portion 10 is a portion containing a transparent electrode transmitting light and does not mean containing no electrode. The light transmitting portion 10 can transmit light from the light absorbing layer 3 in a direction of the substrate 1, and conversely can transmit light from the substrate 1 in a direction of the light absorbing layer 3. Furthermore, the metal portions 9 are present in the non-light transmitting portion 11, and this portion does not transmit light, but can diffuse an alkali metal in the substrate 1 into the light absorbing layer 3. For example, the metal portions 9 are disposed so as to be separated from each other in a dot shape as viewed from a direction of incidence of light.

The light transmitting portion 10 is a portion including a transparent electrode containing a semiconductor film. As the transparent electrode, for example, a semiconductor film containing indium-tin oxide (ITO) can be used.

A layer containing an oxide such as $SnO_2$, $TiO_2$, or carrier doped ZnO:Ga or ZnO:Al may be stacked between the light transmitting portion 10 and the light absorbing layer 3.

The non-light transmitting portion 11 is a portion having the metal portions 9, and has an effect of improving current characteristics by suppressing oxidation of a compound semiconductor constituting the light absorbing layer 3 and diffusing an alkali metal derived from the substrate 1 into the light absorbing layer 3. Each of the metal portions 9 is preferably constituted by a material which does not react with the light absorbing layer 3, a material which hardly reacts with the light absorbing layer 3, or a material which can ensure conductivity even if the material reacts with the light absorbing layer 3. Therefore, each of the metal portions 9 preferably contains at least one selected from the group consisting of: a metal, an alloy, and a conductive oxide. When the light absorbing layer 3 contains Se or S, a material constituting each of the metal portions 9 is desirably a material which can withstand corrosion by Se or S. In a case of a metal, a noble metal element or Mo is preferable. Therefore, each of the metal portions 9 desirably contains at least one selected from the group consisting of: Mo, Ru, Rh, Pd, Ag, Ir, Pt, and the like. $RuO_2$, PdO, $Rh_2O_3$, $PtO_2$, $IrO_2$, and the like are preferable as the conductive oxide from a viewpoint of corrosion resistance against Se and S. A metal capable of ohmic contact with the light absorbing layer 3 is preferable, and a metal or a compound (oxide or nitride) having a deep work function is preferable. A metal or compound (oxide) having a work function of 5.4 eV or more is preferable. From these facts, each of the metal portions 9 more preferably contains at least one selected from the group consisting of: Mo, Pt, Ir, and Pd. These metals may be constituted by one kind of material or a combination of two or more kinds of materials.

Figure 2:
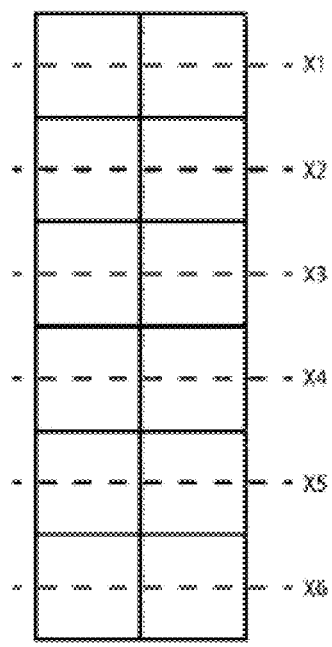
FIG. 2 is an image diagram according to an embodiment.
Figure 3:
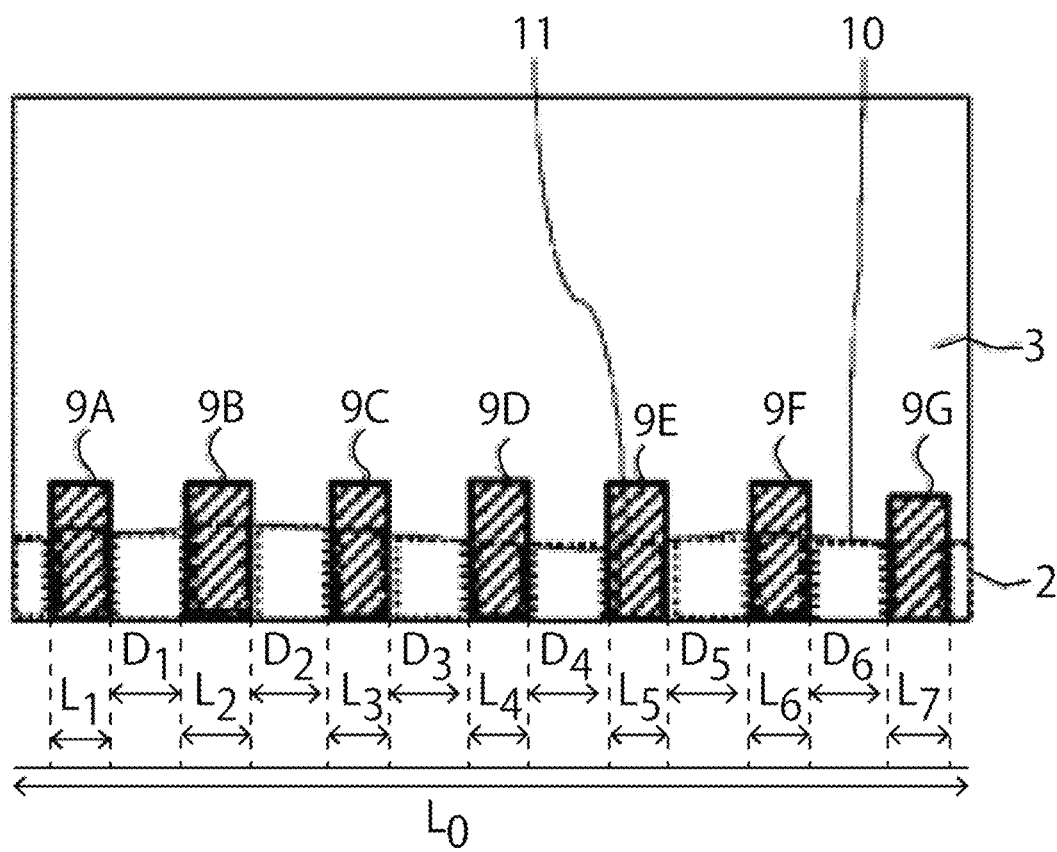
FIG. 3 is a cross-sectional view according to an embodiment.

As illustrated in the image diagram of FIG. 2, a surface of the light absorbing layer 3 facing the first electrode 2 is equally divided into 12 regions (two regions in a horizontal direction and six regions in a vertical direction) in a grid pattern, and a cross section including the central part of each region is observed by a scanning electron microscope (SEM), for example, at a magnification of 40 k. The region is divided into six regions in a long side direction and two regions in a short side direction. When the region has a square shape, the region may be divided into six regions in a long side direction or in a short side direction. A cross section to be observed is a surface including the light absorbing layer 3 and the first electrode 2 in a lamination direction. Furthermore, 12 cross sections to be observed are all in the same direction like the cross sections on imaginary lines X1 to X6 in FIG. 2. An angle of each line passing through the center of a grating region is arbitrarily selected such that the light transmitting portion 10 and the non-light transmitting portion 11 can be observed. A surface where seven metal portions 9 can be confirmed in an SEM image is observed. A region of $6\times10^{-6}$ $mm^2$ in the observation surface is observed to obtain an SEM image as illustrated in the image diagram of FIG. 3. Then, as illustrated in the image diagram of FIG. 3, each of the metal portions 9 (9A, 9B, 9C, 9D, 9E, 9F, and 9G in FIG. 3) is projected toward the first electrode 2. The length of each of the metal portions 9 projected is referred to as $L_1$, $L_2$ . . . , or $L_n$ ($L_1$ to $L_7$ in FIG. 3). Each of $L_1$ to $L_n$ is referred to as a dot diameter of each of the metal portions 9. The width of the first electrode 2 on the observation surface is referred to as $L_0$. The sum of $L_1$ to $L_n$ is referred to as $L_S$. It means that an aperture ratio determined by $(L_S/L_0)^2$ satisfies the above condition for an aperture ratio. That is, $50\% \leq (L_S/L_0)^2 \leq 99.5\%$ is preferable. $61\% \leq (L_S/L_0)^2 \leq 99.5\%$ is more preferable. $80\% \leq (L_S/L_0)^2 \leq 99.5\%$ is still more preferable. A state in which the above condition for an aperture ratio is satisfied in all the 12 cross sections is further still more preferable. It is assumed that this state satisfies the above condition for an aperture ratio as a whole.

The dot diameter of each of the metal portions 9 is preferably 2 nm or more and 20 μm or less. Herein, the dot diameter of each of the metal portions 9 indicates a length of a surface of the light absorbing layer 3 facing the first electrode 2 in a first direction substantially perpendicular to the surface in a lamination direction or in a second direction substantially perpendicular to the first direction. In a case where each of the metal portions 9 has a dot shape, the diameter of a dot is indicated. The dot diameter of each of the metal portions 9 is more preferably 6 nm or more and 10 μm or less. A too large dot diameter of each of the metal portions 9 causes a variation of light transmitting properties, and a too small dot diameter causes the light absorbing layer 3 to be easily oxidized. Therefore, a too large or too small dot diameter is not preferable.

The length (thickness) of each of the metal portions 9 in a lamination direction is not particularly limited, but is preferably equal to or thicker than the film thickness of the first electrode 2 because the light absorbing layer 3 is not easily oxidized. An alkali metal is easily diffused only by disposing the metal portions 9 in the first electrode 2. Therefore, the length (thickness) of each of the metal portions 9 in a lamination direction may be thinner than the film thickness of the first electrode 2. In a case where mobility of the light absorbing layer 3 is not so high, use of the hollow metal portions 9 with holes is preferable in that the aperture ratio can be increased while an interval between the metal portions 9 is reduced.

For example, use of a material having a columnar crystal in observation with SEM, such as Mo, is desirable because an alkali metal is diffused into a gap by heating during film formation and is easily diffused into the light absorbing layer. In a case where an electrode becomes thick, diffusion can be controlled by adjusting heating time and temperature.

In a case where seven metal portions 9 cannot be confirmed in an SEM observation image, magnification is appropriately changed, and in some cases, transmission electron microscope (TEM) observation is performed.

Furthermore, a difference in a dot diameter between the metal portions 9 is preferably small. Herein, an average value of $L_1, L_2 \ldots$ and $L_n$ is referred to as $L_{AVE}$. A maximum value of $L_1, L_2 \ldots$ and $L_n$ is referred to as $L_{MAX}$. A minimum value of $L_1, L_2 \ldots$ and $L_n$ is referred to as $L_{MIN}$. At this time, a case where $0.8\ L_{AVE} \leq L_{MIN} \leq L_{MAX} \leq 1.2\ L_{AVE}$ is satisfied means that a minimum value and a maximum value of the dot diameters of the metal portions 9 are 0.8 times or more and 1.2 times or less an average value of the dot diameters of the metal portions 9, and is preferable. Similarly, a case where $0.9\ L_{AVE} \leq L_{MIN} \leq L_{MAX} \times 1.1\ L_{AVE}$ is satisfied means that a minimum value and a maximum value of the dot diameters of the metal portions 9 are 0.9 times or more and 1.1 times or less the average value of the dot diameters of the metal portions 9, and is more preferable. Furthermore, a difference in a dot diameter between the metal portions 9 is preferably small in all the 12 cross sections. It is assumed that this state satisfies a condition that a difference in a dot diameter between the metal portions 9 is small as a whole.

Furthermore, if the metal portions 9 are unevenly present, a light transmitting property is low in a region having a large number of the metal portions 9, and a surface of the light absorbing layer 3 facing the first electrode 2 is easily oxidized in a region having a small number of the metal portions 9. Therefore, the case where the metal portions 9 are unevenly present is not preferable. Therefore, a difference in an interval between the metal portions 9 is preferably small. A minimum value and a maximum value of an interval between the metal portions 9 are preferably 0.8 times or more and 1.2 times or less an average value of intervals between the metal portions 9. The minimum value and the maximum value of an interval between the metal portions 9 are more preferably 0.9 times or more and 1.1 times or less the average value of intervals between the metal portions 9. A variation of intervals between the metal portions 9 will be described with reference to the image diagram of FIG. 3. An SEM image used for determining an interval between the metal portions 9 is the same as the SEM image for determining the aperture ratio. Each of the metal portions 9 (9A, 9B, 9C, 9D, 9E, 9F, and 9G in FIG. 3) is projected toward the first electrode 2. Distances between the projected portions $L_1, L_2 \ldots$ and $L_n$ ($L_1$ to $L_7$ in FIG. 3) are referred to as $D_1, D_2 \ldots$ and $D_n$ ($D_1$ to $D_6$ in FIG. 3). An average value of $D_1, D_2 \ldots$ and $D_n$ is referred to as $D_{AVE}$. A maximum value of $D_1, D_2 \ldots$ and $D_n$ is referred to as $D_{MAX}$. A minimum value of $D_1, D_2 \ldots$ and $D_n$ is referred to as $D_{MIN}$. At this time, a case where $0.8\ D_{AVE} \leq D_{MIN} \leq D_{MAX} \leq 1.2\ D_{AVE}$ is satisfied means that a minimum value and a maximum value of intervals between the metal portions 9 are 0.8 times or more and 1.2 times or less an average value of intervals between the metal portions 9. Similarly, a case where $0.9\ D_{AVE} \leq D_{MIN} \leq D_{MAX} \leq 1.1\ D_{AVE}$ is satisfied means that a minimum value and a maximum value of intervals between the metal portions 9 are 0.9 times or more and 1.1 times or less the average value of intervals between the metal portions 9. An interval between the metal portions 9 is preferably 0.8 nm or more and 24 μm or less from the same viewpoint. When the metal portions 9 are uniformly dispersed in this way, a variation of light transmitting properties is small, and an optical characteristic of the solar cell 100 is improved. In a case where the metal portions 9 have the same aperture ratio and the same size, the more uniformly the metal portions 9 are dispersed, the higher a function of preventing oxidation of the light absorbing layer 3 is, and this case is preferable. It is considered that this is because oxidation tends to proceed in a region having an extremely small number of the metal portions 9 or having no metal portion 9 and formation of an oxide film is hindered by only a small amount of the metal portions 9, resulting in improvement in a conversion efficiency. Therefore, a state in which the above condition for an interval between the metal portions 9 is satisfied in all the 12 cross sections is also preferable. It is assumed that this state satisfies the above condition for an interval between the metal portions 9 as a whole.

The light transmitting portion 10 and the non-light transmitting portion 11 of the first electrode 2 can be formed by a method for forming a metal film, an oxide film, or a nitride film and processing the film into an arbitrary metal portion pattern using a mask, or by performing imprinting using a mold having a metal portion pattern shape.

The film thickness of the first electrode 2 is, for example, 100 nm or more and 1000 nm or less.

The solar cell 100 according to the present embodiment also has a function of suppressing formation of an oxidized region at an interface between the light absorbing layer 3 described below and the first electrode 2, concentrates an electric field in the metal portions 9 due to the metal portions 9 serving as contact portions, suppresses interface recombination, and can improve an open circuit voltage. When oxidation of the light absorbing layer 3 is suppressed, an open circuit voltage is improved and a conversion efficiency is improved. When an insulating layer is introduced onto the first electrode 2, a contact portion between an electrode and the light absorbing layer 3 described below is physically reduced (an insulating region corresponds to a passivation film). Interface recombination can be further suppressed, and a high open circuit voltage can be maintained. Furthermore, in FIG. 1, the metal portions 9 and the substrate 1 are in direct contact with each other. Therefore, diffusion of an alkali metal is promoted from the substrate 1 to an inside of the light absorbing layer 3 through the metal portions 9. By compensation of defects in the light absorbing layer 3 by an alkali metal, current characteristics can be improved. A high light transmitting property is a characteristic suitable for use of a multijunction solar cell as a top cell. The solar cell 100 of the embodiment is suitable not only for use in a multijunction solar cell but also for use in a solar cell requiring transparency.

A function of oxidation prevention of the light absorbing layer 3 occurs even at an extremely high aperture ratio. A specific aperture ratio is preferably 50% or more and 99.95% or less. An aperture ratio of less than 50% lowers a light transmitting property, and is not preferable. The aperture ratio is represented by two significant digits (rounding off) at an aperture ratio of less than 99%, and is represented by three significant digits or four significant digits (rounded off) at an aperture ratio of 99% or more. An aperture ratio of more than 99.95% hardly exhibits an effect of oxidation prevention of the light absorbing layer 3, and hardly contributes to improvement in a conversion efficiency. The aperture ratio is more preferably 61% or more and 99.95% or less, and still more preferably 80% or more and 99.95% or less, and still much more preferably 81% or more and 99.95% or less. A reason why a function of oxidation prevention is exhibited even at such a high aperture ratio is considered that the metal portions 9 are dispersed between the light absorbing layer 3 and the first electrode 2 and thereby inhibit formation of an oxide film. A contact resistance is generated between a compound semiconductor of the light absorbing layer 3 and an electrode. However, conduction through a low resistance metal is predominant in this portion, and an oxide film is hardly formed in a portion where a metal is present. Therefore, a good contact is formed. Therefore, a current is collected in the metal portions 9, and an effective function is exhibited while a high aperture ratio is maintained.

The shape of each of the metal portions 9 as viewed from a direction of incidence of light is not particularly limited. Specific examples of the shape include circular, elliptical, and polygonal shapes. These circular, elliptical, and polygonal shapes may be hollow (O type or the like) or may have openings (C type, bracket shape, or the like), and are not particularly limited. In addition, as the shape of each of the metal portions 9 as viewed from a direction of incidence of light, the metal portions 9 may be disposed in an array shape without being separated, or may be disposed in a fence shape.

In the example of FIG. 1, each of the metal portions 9 penetrates the first electrode 2 and is in contact with the substrate 1 and the light absorbing layer 3. However, each of the metal portions 9 is only required to be disposed so as to promote diffusion of an alkali metal from the substrate 1 to the light absorbing layer 3. Specifically, a structure in which the metal portions 9 are in direct contact with the substrate 1 but are not in direct contact with the light absorbing layer 3, or a structure in which the metal portions 9 are in direct contact with the light absorbing layer 3 but are not in direct contact with the substrate 1 may be used.

(Light Absorbing Layer)

The light absorbing layer 3 in the embodiment is a heterojunction layer including n-type and p-type compound semiconductor layers. The light absorbing layer 3 is present between the first electrode 2 and the second electrode 6, and supplies electrons from an interface between the n-type and p-type compound semiconductor layers to the second electrode 6 due to light passing through the light absorbing layer 3 from above the second electrode 6.

In the n-type compound semiconductor, a Fermi level is preferably controlled such that a photoelectric conversion element with a high open circuit voltage can be obtained. Examples of the n-type compound semiconductor include $Zn_{1-y}M_yO_{1-x}S_x$, $Zn_{1-y-z}Mg_zM_yO$, $ZnO_{1-x}S_x$, $Zn_{1-z}Mg_zO$ (M is at least one element selected from the group consisting of: B, Al, In, and Ga), CdS, and n-type GaP with a controlled carrier concentration. The thickness of the n-type compound semiconductor is preferably 2 nm or more and 800 nm or less. A film of the n-type compound semiconductor is formed, for example, by sputtering or chemical bath deposition (CBD). In a case of forming a film of the n-type compound semiconductor by CBD, for example, a metal salt (for example, $CdSO_4$), a sulfide (thiourea), and a complexing agent (ammonia) can be formed on the light absorbing layer 3 by a chemical reaction in an aqueous solution. In a case where a chalcopyrite type compound containing no In as an element in group IIIb, such as a $CuGaSe_2$ layer, an $AgGaSe_2$ layer, a $CuGaAlSe_2$ layer, or a $CuGa(Se,S)_2$ layer, is used for the light absorbing layer 3, CdS is preferable as the n-type compound semiconductor.

The p-type compound semiconductor contains a compound containing elements in group I, group III, and group VI. The element in group I preferably contains at least Cu. The element in group III preferably contains at least Ga. The element in group VI preferably contains at least Se. For example, a compound semiconductor having a chalcopyrite structure containing an element in group I (group Ib), an element in group III (group IIIb), and an element in group VI (group VIb), such as $Cu(In,Ga)Se_2$, $CuInTe_2$, $CuGaSe_2$, $Cu(In,Al)Se_2$, $Cu(Al,Ga)(S,Se)_2$, $Cu(In,Ga)(S,Se)_2$, $CuGa(S,Se)_2$, or $Ag(In,Ga)Se_2$ can be used as the p-type compound semiconductor. Preferably, the element in group Ib is formed of Cu or Cu and Ag, the element in group IIIb is formed of at least one element selected from the group consisting of: Ga, Al, and In, and the element in group VIb is formed of at least one element selected from the group consisting of: Se, S, and Te. Among these cases, more preferably, the element in group Ib is formed of Cu, the element in group IIIb is formed of Ga, Al, or Ga and Al, and the element in group VIb is formed of Se, S, or Se and S. A case where the amount of In is small in the element in group IIIb is preferable because a band gap of the light absorbing layer 3 can be easily adjusted to a suitable value as a top cell of a multijunction solar cell. The film thickness of the light absorbing layer 3 is, for example, 800 nm or more and 3000 nm or less.

By combining elements, the magnitude of a band gap can be easily adjusted to a target value. The target value of a band gap is, for example, 1.0 eV or more and 2.7 eV or less.

(Second Electrode)

The second electrode 6 in the embodiment is an electrode film transmitting light like sunlight and having conductivity. The second electrode 6 is disposed on the light absorbing layer 3. A film of the second electrode 6 is formed, for example, by sputtering or a chemical vapor deposition (CVD) method in an Ar atmosphere. For the second electrode 6, for example, ZnO:Al using a ZnO target containing 2 wt % of alumina ($Al_2O_3$) or ZnO:B using B as a dopant from diborane or triethylboron can be used.

(Manufacturing Method)

Figure 4:
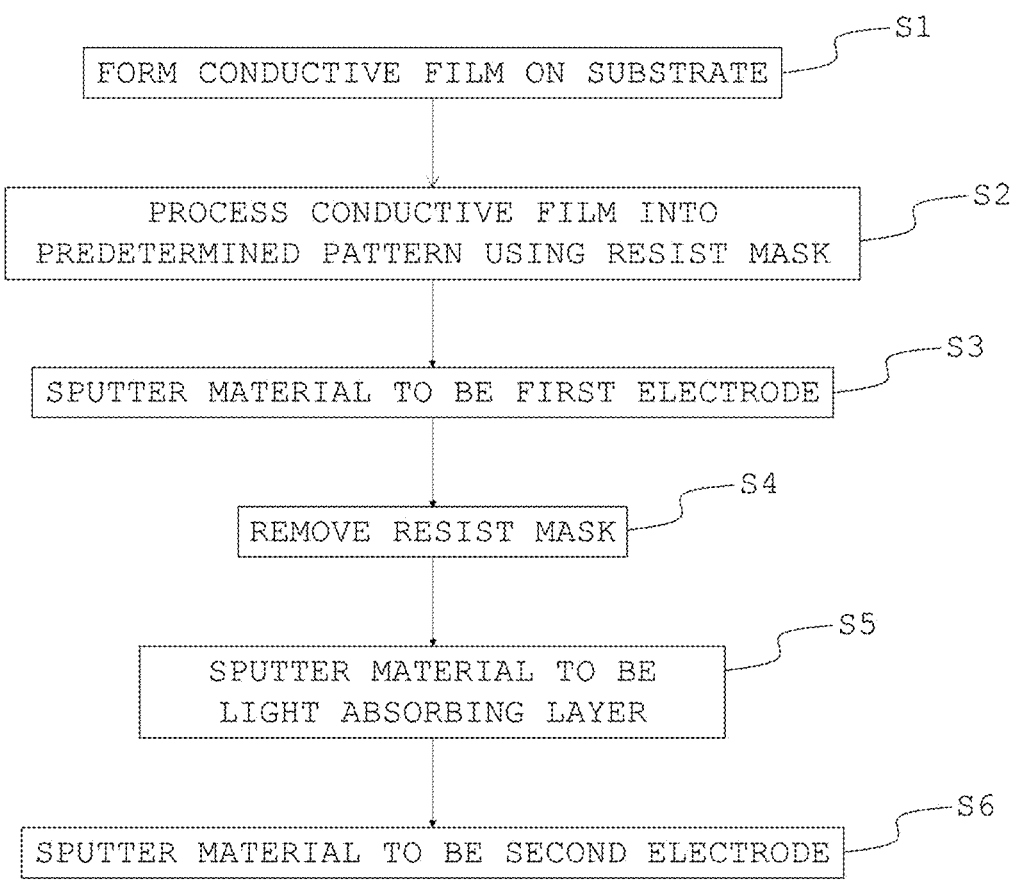
FIG. 4 is a flowchart of a manufacturing method according to an embodiment.

A manufacturing method in the present embodiment is illustrated in a flowchart with reference to FIG. 4.

A metal portion 9 film is formed on the substrate 1 (FIG. 4 (S1)). The metal portion 9 film is processed into a predetermined pattern (determined such that a distribution of dots has a desired aperture ratio) using a resist mask (FIG. 4 (S2)). Thereafter, a film of a material to be the first electrode 2 is formed by sputtering or the like (FIG. 4 (S3)). The resist mask is removed (FIG. 4 (S4)). Thereafter, a film of a material to be the light absorbing layer 3 is formed by sputtering or the like (FIG. 4 (S5)). A film of a material to be the second electrode 6 is formed by sputtering or the like (FIG. 4 (S5)).

The manufacturing method is not limited to the above method. For example, a film of a material to be the first electrode 2 is formed on the substrate 1 by sputtering, then the first electrode 2 is processed into a predetermined pattern using a resist mask, and a material to be the metal portions 9 is sputtered. Finally, the resist mask is removed. Such a manufacturing method can also be performed similarly.

Modification Example of the First Embodiment

In the first embodiment, a third electrode may be included.

The third electrode (not illustrated) in the embodiment is an electrode of the solar cell 100 and is a metal film formed on the second electrode 6. When the third electrode is further included, current collection can be performed more efficiently.

As the third electrode, a conductive metal film such as Ni or Al can be used. The film thickness of the third electrode is, for example, 200 nm or more and 2000 nm or less. In addition, for example, in a case where a resistance value of the second electrode 6 is low and a series resistance component is negligible, the third electrode may be omitted.

In the first embodiment, an antireflection film may be included.

The antireflection film in the embodiment is a film for facilitating introduction of light into the light absorbing layer 3 and is formed on the second electrode 6 or the third electrode. As the antireflection film, for example, $MgF_2$ or $SiO_2$ is desirably used. In the embodiment, the antireflection film can be omitted. It is necessary to adjust the film thickness according to a refractive index and a film thickness of each layer, but vapor deposition is preferably performed at 70 to 130 nm (preferably 80 to 120 nm).

In the first embodiment, an oxide layer may be included.

The oxide layer in the embodiment is a thin film preferably disposed between the light absorbing layer 3 and the second electrode 6. The oxide layer is a thin film containing any one compound selected from the group consisting of: $Zn_{1-x}Mg_xO$, $ZnO_{1-y}S_y$, and $Zn_{1-x}Mg_xO_{1-y}S_y$ ($0 \leq x$, $y<1$). A form in which the oxide layer covers not the entire surface between the light absorbing layer 3 and the second electrode 6 may be used. For example, the oxide layer only requires covering 50% of a surface of the light absorbing layer 3 on a side of the second electrode 6. Examples of other candidates include Wurtzite type AlN, GaN, and BeO. A volume resistivity of the oxide layer of 1 Ωcm or more has such an advantage that a leak current derived from a low resistance component which may be present in the light absorbing layer 3 can be suppressed. Note that in the embodiment, the oxide layers can be omitted. These oxide layers are oxide particle layers, and preferably include many voids therein. An intermediate layer is not limited to the above compounds and physical properties, but may be any layer as long as contributing to improvement in a conversion efficiency of a solar cell or the like. The intermediate layer may be a plurality of layers having different physical properties.

Second Embodiment

Description common between the first embodiment and the second embodiment will be omitted.

Figure 5:
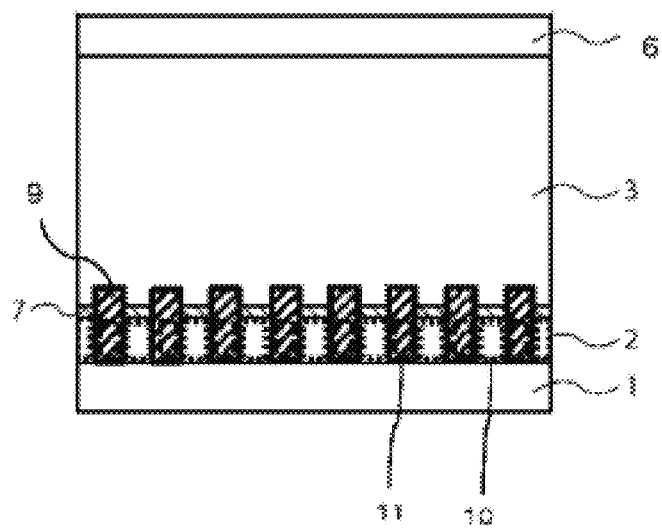
FIG. 5 is a cross-sectional conceptual view of a solar cell according to an embodiment.

As illustrated in FIG. 5, a solar cell according to the present embodiment includes a first insulating film 7 between the first electrode 2 and the light absorbing layer 3 in the light transmitting portion 10 in the first embodiment.

By inclusion of the first insulating film 7, electrical conduction between the first electrode 2 and the light absorbing layer 3 can be suppressed, a curvature factor FF is improved, and a conversion efficiency is improved.

(First Insulating Film)

The first insulating film 7 is present between the first electrode 2 and the light absorbing layer 3 in the light transmitting portion 10. The first insulating film 7 is a light transmitting film preventing oxidation of the light absorbing layer 3. Oxidation of the light absorbing layer 3 can be partially prevented by the metal portions 9. A lower aperture ratio is better from a viewpoint of preventing oxidation, but is not preferable because a transmittance of light is lowered. In addition, in a solar cell in which the first insulating film 7 is disposed on the entire surface between the light absorbing layer 3 and the first electrode 2 and no metal portion 9 is disposed, contact between an electrode and the light absorbing layer 3 is not good, and a conversion efficiency is not improved. Simply introducing an insulating film increases a series resistance component (Rs) of the solar cell and decreases an efficiency.

As the first insulating film 7, either an oxide film or a nitride film can be used. Specifically, as the oxide film, one or more kinds of films selected from the group consisting of: $AlO_x$, $SiO_x$, $MgO_x$, and $(Al,Si,Mg)O_x$ are preferable. As the nitride film, one or more kinds of films selected from the group consisting of: $SiN_x$, $AlN_x$, $GaN_x$, and $(Si,Al,Ga)N_x$ are preferable. The thickness of the first insulating film 7 is preferably 1 nm or more and 80 nm or less. The thickness of the first insulating film 7 is more preferably 5 nm or more and 50 nm or less. Even if the first insulating film 7 does not cover the entire surface between the first electrode 2 and the light absorbing layer 3 in the light transmitting portion 10, the above effect is exhibited. The first insulating film 7 is preferably present on the entire surface between the first electrode 2 and the light absorbing layer 3 in the light transmitting portion 10 from a viewpoint of oxidation prevention and improvement in FF and from a viewpoint of a film formation process.

Figure 6A:
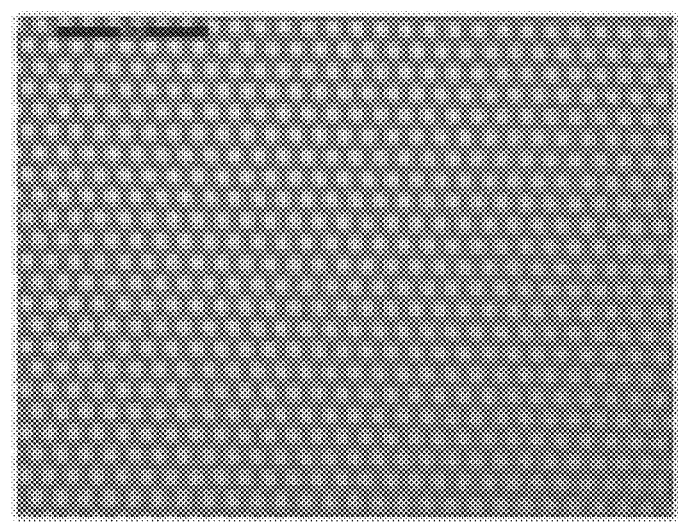
FIGS. 6A and 6B are optical microscope images according to an embodiment.
Figure 6B:
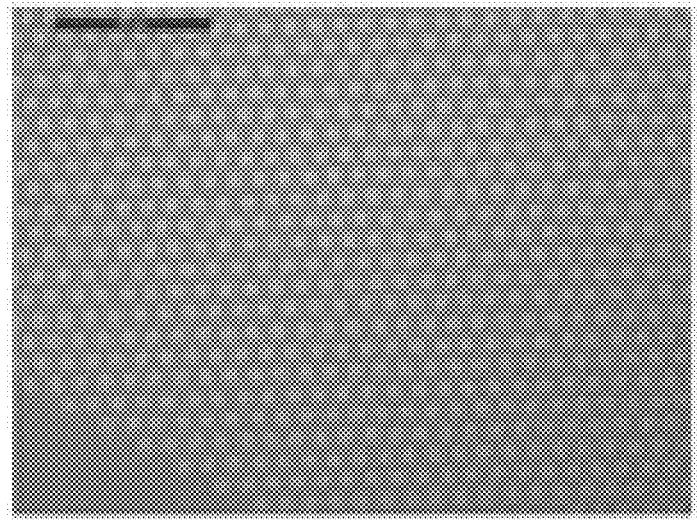

FIGS. 6A and 6B illustrate optical microscope images of a member having the first insulating film 7 formed on the first electrode 2. FIG. 6A illustrates an optical microscope image of a metal made of molybdenum and having a hollow circular shape (O shape), a metal portion 9 length (diameter) of 5 μm, a metal portion 9 interval of 8 μm, an aperture ratio of 82%, and a metal portion 9 height of 50 nm. Note that the first insulating film 7 is also present between the first electrode 2 and the light absorbing layer 3 in the hollow portion. In FIG. 6A, $AlO_x$ having a thickness of 40 nm is formed as the first insulating film 7. FIG. 6B is the same as FIG. 6A except that $SiN_x$ is used as the first insulating film 7. In each of the SEM images, a uniform metal portion 9 pattern is formed. Note that each of the members illustrated in the optical microscopic images in FIGS. 6A and 6B includes a region where the metal portions 9 are not formed in a peripheral portion. A case where the shape of each of the metal portions 9 is hollow and the metal portions 9 are arranged in a uniform pattern as illustrated in FIGS. 6A and 6B is preferable in that regardless of presence or absence of the first insulating film 7, in a case where mobility of the light absorbing layer 3 is not so high, use of the hollow metal portions 9 with holes can reduce an interval between the metal portions 9 and can increase an aperture ratio.

(Manufacturing Method)

The solar cell 101 is manufactured in a similar manner to the first embodiment except that a step of sputtering a material to be the first insulating film 7 is added between S3 and S4 in FIG. 4.

(Third Embodiment) (Multijunction Solar Cell)

Figure 7:
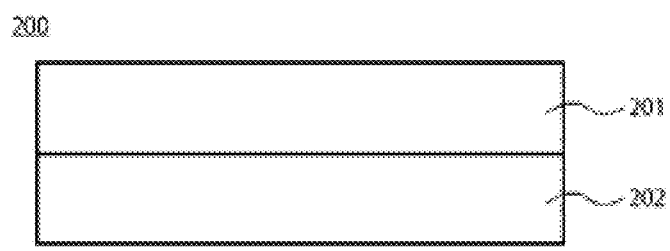
FIG. 7 is a cross-sectional conceptual view of a multijunction solar cell according to an embodiment.

The third embodiment is a multijunction solar cell using the solar cell of the first embodiment. FIG. 7 is a schematic cross-sectional view of the multijunction solar cell 200 of the third embodiment. The multijunction solar cell 200 of FIG. 7 includes a solar cell 201 as a top cell and a solar cell 202 as a bottom cell. The solar cell 100 of the first embodiment or the solar cell 101 of the second embodiment is used as the top cell 201 of the multijunction solar cell 200. Light which has passed through the substrate 1 of the solar cell 201 as a top cell is incident on the solar cell 202 as a bottom cell subsequently. For the solar cell 202 as a bottom cell, for example, a solar cell having a light absorbing layer of Si, or the solar cell 100 of the first embodiment or the solar cell 101 of the second embodiment having the light absorbing layer 3 with a narrower gap than the solar cell 201 as a top cell can also be used. In a case where the solar cell 100 of the first embodiment is used as a top cell, preferably, the element in group I is Cu, the element in group III is Ga, and the element in group VI is Se from a viewpoint of an absorption wavelength and a conversion efficiency. The light absorbing layer of the solar cell 100 of the first embodiment has a wide gap, and therefore is preferably used as a top cell.

In a case where the solar cell 100 of the first embodiment is used as a bottom cell, preferably, the element in group I is Cu, the element in group III is In and Ga, and the element in group VI is Se from a viewpoint of an absorption wavelength and a conversion efficiency.

(Fourth Embodiment) (Solar Cell Module)

The solar cells of the first to third embodiments can be used as power generating elements in a solar cell module of a fifth embodiment. Power generated by the solar cells of the embodiments is consumed by a load electrically connected to the solar cells or stored in a storage battery electrically connected to the solar cells.

The solar cell module of the embodiment has a structure in which a member obtained by connecting a plurality of cells of a solar cell in series, in parallel, or in series and in parallel or a single cell is fixed to a support member such as glass. The solar cell module may have a structure in which a light collector is disposed to convert light received at an area larger than an area of a photovoltaic cell into power. A photovoltaic cell includes solar cells connected in series, in parallel, or in series and in parallel.

Figure 8:
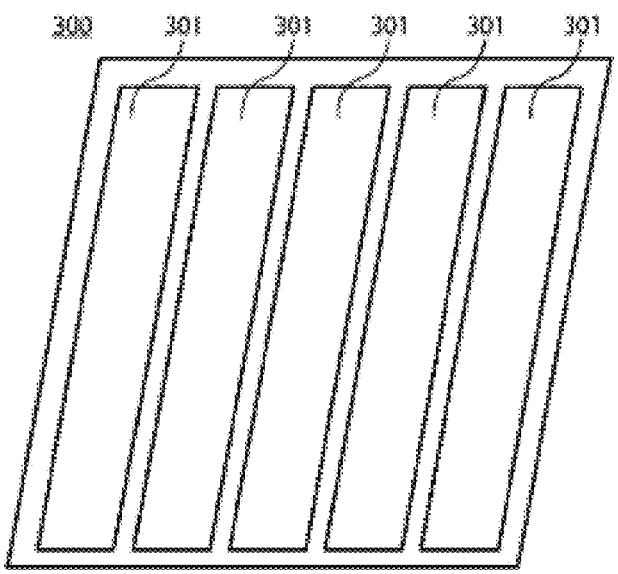
FIG. 8 is a conceptual diagram of a solar cell module according to an embodiment.

FIG. 8 illustrates a conceptual configuration diagram of a solar cell module 300 in which a plurality of photovoltaic cells 301 is arranged such that six cells are arranged in a horizontal direction and six cells are arranged in a vertical direction. The solar cell module 300 in FIG. 8 omits connection wiring, but as described above, the plurality of photovoltaic cells 301 is preferably connected in series, in parallel, or in series and in parallel. For each of the photovoltaic cells 301, any one of the solar cell 100 of the first embodiment to the multijunction solar cell 200 of the third embodiment is preferably used. The solar cell module 300 of the embodiment may adopt a module structure in which a module using any one of the solar cell 100 of the first embodiment to the multijunction solar cell 200 of the third embodiment and a module using another solar cell are stacked. Ii addition, a structure for enhancing a conversion efficiency is preferably adopted. In the solar cell module 300 of the embodiment, each of the photovoltaic cells 301 has a photoelectric conversion layer with a wide band gap, and therefore is preferably disposed on a side of a light receiving surface.

Fifth Embodiment

Figure 9:
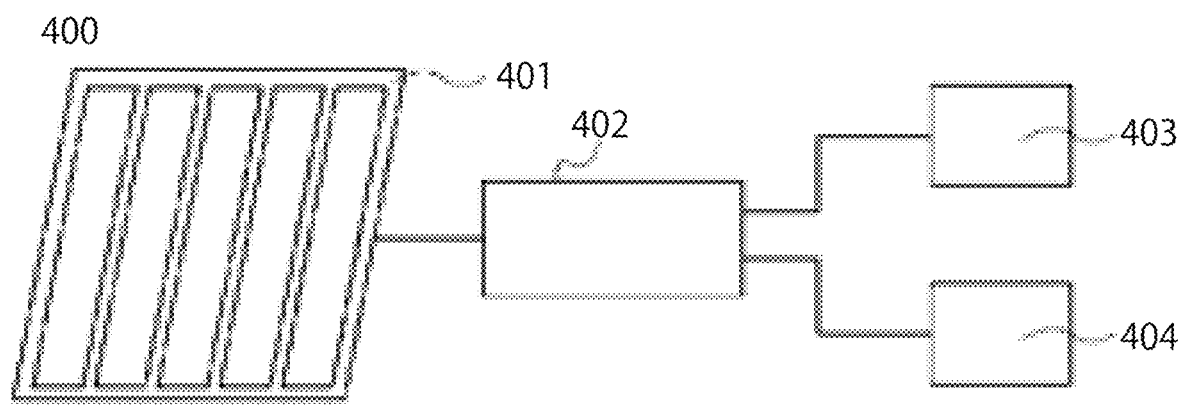
FIG. 9 is a conceptual diagram of a solar power generation system according to an embodiment.

The solar cell module of the embodiment can be used as a power generator for generating power in a solar power generation system of the fifth embodiment. The solar power generation system 400 of the embodiment performs power generation using a solar cell module. Specifically, the solar power generation system includes a solar cell module for generating power, a means for converting generated power, and a storage means for storing generated power or a load consuming generated power. FIG. 9 illustrates a conceptual configuration diagram of a solar power generation system 400 of the embodiment. The solar power generation system 400 of FIG. 9 includes a solar cell module 401 (300), a converter 402, a storage battery 403, and a load 404. Either the storage battery 403 or the load 404 may be omitted. The load 404 may have a structure capable of utilizing electric energy stored in the storage battery 403. The converter 402 is a device including a circuit or an element for performing voltage transformation such as DC-DC converter, DC-AC converter, or AC-AC converter, or power conversion such as DC AC conversion. For the structure of the converter 402, it is only required to adopt a suitable structure according to a voltage of generated power, and the structures of the storage battery 403 and the load 404.

Each of the photovoltaic cells 301 which have received light, included in the solar cell module 300 generates power, and electric energy thereof is converted by the converter 402, and is stored in the storage battery 403 or consumed by the load 404. Preferably, a sunlight tracking drive device for constantly directing the solar cell module 401 to the sun is disposed in the solar cell module 401, a condenser for collecting sunlight is disposed therein, or a device for improving a power generation efficiency or the like is added thereto.

The solar power generation system 400 is preferably used for real estate such as residence, a commercial facility, or a factory, or for a movable item such as a vehicle, an aircraft, or an electronic device. An increase in the amount of power generation is expected by using a photoelectric conversion element having an excellent conversion efficiency in the embodiment for the solar cell module 401.

Hereinafter, the present disclosure will be described more specifically based on Examples, but the present disclosure is not limited to the following Examples.

Example 1

Two solar cells of a top cell and a bottom cell are joined to each other to manufacture a multijunction solar cell. A conversion efficiency of the multijunction solar cell, Voc (release voltage), Jsc (short circuit current density), FF (output factor), a transmittance of light (average of 700 nm to 1150 nm), an aperture ratio, and a conversion efficiency of the top cell, and a conversion efficiency of the bottom cell are evaluated. First, a method for manufacturing the top cell will be described. High transmittance glass or soda-lime glass is used as a substrate. Films of ITO (150 nm) and $SnO_2$ (100 nm) are formed as a first electrode by sputtering. A hole is formed in the first electrode using lithography, and a metal portion (diameter of introducer: 3 μm, thickness: 250 nm) is introduced into the hole. Here, the aperture ratio is 86%. In this example, Mo is used as the metal portion. Thereafter, heating is performed to 370° C., and Ga and Se (S) are vapor-deposited thereon. While the substrate temperature is raised to 520° C., Cu and Se (S) are vapor-deposited. When an endothermic reaction is observed, vapor-deposition is continued until 10% of Cu and Se (S) deposition time passes, and finally Ga and Se (S) are vapor-deposited. When a desired Cu/Ga composition is reached, vapor-deposition of Ga is stopped, annealing is performed for five minutes as it is, and then the temperature of the substrate is lowered. When the temperature of the substrate is lowered to 380° C., vapor-deposition of Se (S) is stopped.

Note that a hole is formed in the first electrode, and then the metal portion may be introduced into the hole using imprinting.

A CdS layer is manufactured as an n-type compound semiconductor by a CBD method. Cadmium sulfate is dissolved in an aqueous ammonia solution. Thiourea is put thereinto, is taken out after 300 seconds, and is washed with water. An organic Zn compound is applied onto the substrate by spin coating. Heating is performed at 120° C. for five minutes to manufacture a ZnO protective layer of 15 to 30 nm.

ZnO:Al is manufactured as a second electrode by sputtering. The substrate temperature is desirably from 0 to 150°

C. A case where film formation is performed at a relatively low temperature is preferable because an open circuit voltage tends to be large.

Ni/Al is vapor-deposited as a third electrode. A case where Ni is first vapor-deposited is desirable because conductivity can be maintained even if oxidation occurs at an interface with the second electrode. Al is vapor-deposited thereon. The film thicknesses are preferably about 60 nm and 500 nm, respectively.

$MgF_2$ is vapor-deposited at a thickness of 100 nm as an antireflection film.

Next, a method for manufacturing the bottom cell will be described.

An Si wafer having a thickness of 0.5 μm is prepared, and an n-type dopant is ion-implanted into the Si wafer on a side of light irradiation. In order to form a good contact, n+ type is formed just below Ag wiring. An antireflection film is formed thereon. A passivation layer (region) is formed on a back side thereof using $SiN_x$. By forming a portion where $SiN_x$ is not present and making only a part conductive with a back surface Al electrode, recombination at a crystal interface can be reduced and a bottom cell with a high efficiency can be obtained.

A method for measuring a conversion efficiency will be described.

Using a solar simulator simulating a light source of AM1.5G, the amount of light is adjusted so as to obtain 1 sun using a Si cell as a reference at air temperature of 25° C. under the light source. A voltage is swept, and a current density (value obtained by dividing a current by a cell area) is measured. When a horizontal axis indicates a voltage and a vertical axis indicates a current density, a point crossing the horizontal axis is an open circuit voltage Voc, and a point crossing the vertical axis is a short circuit current density Jsc. When a voltage is multiplied by a current density on a measurement curve, and a voltage and a current density at a point having a maximum value of a product of a voltage and a current density are referred to as Vmpp and Jmpp (maximum power points of voltage and current), respectively, FF is determined by FF=(Vmpp×Jmpp)/(Voc×Jsc).

Efficiency *Eff.* is determined by *Eff.=Voc×Jsc×FF.*

A transmittance is determined by measuring a ratio of transmitted light to incident light such that a sample surface is perpendicular to a light source using a spectrophotometer. A reflectance is determined by measuring reflected light of a sample tilted by about five degrees from a direction perpendicular to incident light. A band gap is determined from the transmittance and the reflectance. An average value of transmitted light at a wavelength of 700 nm to 1150 nm is calculated in Example 1 using a wavelength range from a wavelength of a region where transmittance is large at a band gap or lower (transmittance of 50% or more as a guide) to a wavelength which can be absorbed by a bottom cell as a guide.

Results are summarized in Table 1. Results in other Examples and Comparative Example are also summarized in Table 1 similarly.

Comparative Example 1

A solar cell as a top cell is manufactured in a similar manner to Example 1 except that a solar cell as a top cell, having an aperture ratio of 100% without a metal portion is manufactured, and a multijunction solar cell in Comparative Example 1 is obtained. Then, the solar cell is evaluated in a similar manner to Example 1.

Examples 2 to 8

A solar cell as a top cell is manufactured in a similar manner to Example 1 except that a solar cell as a top cell is manufactured by changing a dot diameter of a metal portion, and multijunction solar cells in Comparative Examples 2 to 8 are obtained. Then, the solar cells are evaluated in a similar manner to Example 1. Note that the dot diameters of the metal portions in Examples 2 to 8 are 4, 5, 6, 7, 8, 9, and 10 μm, respectively.

Examples 9 to 17

A solar cell as a top cell is manufactured in a similar manner to Example 4 except that a solar cell as a top cell is manufactured by changing an aperture ratio, and multijunction solar cells in Examples 9 to 17 are obtained. Then, the solar cell is evaluated in a similar manner to Example 1. Note that the aperture ratios of Examples 9 to 17 are 56, 62, 72, 81, 86, 92, 94, and 99.95%, respectively.

Examples 18 to 20

In Examples 18 to 20, a region is formed in a similar manner to Example 1 by making the shape of a metal portion circular and making the dot diameter (diameter) of the metal portion 6 μm. The metal portion is hollow and has a circular cavity. The diameters of the hollow circles in the metal portions in Examples 18 to 20 are 1 μm, 1.5 μm, and 2 μm, respectively. A solar cell as a top cell is manufactured in a similar manner to Example 1 except for these, and multijunction solar cells in Examples 18 to 20 are obtained. Then, the solar cell is evaluated in a similar manner to Example 1.

Examples 21 and 22

In Examples 21 and 22, a solar cell as a top cell is manufactured in a similar manner to Example 4 except that a portion just above a first electrode is covered with $AlO_x$ at a film thickness of 5 or 15 nm, and multijunction solar cells in Examples 21 and 22 are obtained. Then, the solar cell is evaluated in a similar manner to Example 1.

Examples 23 to 25

In Examples 23 to 25, a solar cell as a top cell is manufactured in a similar manner to Example 4 except that a portion just above a first electrode is covered with $SiN_x$ at a film thickness of 5, 10, or 20 nm, and multijunction solar cells in Examples 23 to 25 are obtained. Then, the solar cell is evaluated in a similar manner to Example 1.

Examples 26 and 27

In Examples 26 and 27, a solar cell as a top cell is manufactured in a similar manner to Example 4 except that a solar cell as a top cell is manufactured by changing a thickness of a metal portion to 200 nm or 300 nm, and multijunction solar cells in Examples 26 and 27 are obtained. Then, the solar cells are evaluated in a similar manner to Example 1.

Examples 28 and 29

In Examples 28 and 29, a solar cell as a top cell is manufactured in a similar manner to Example 4 except that a solar cell as a top cell is manufactured by covering a portion just above a first electrode with $SiN_x$ at a film thickness of 10 or 20 nm and changing a thickness of a metal portion to 300 nm, and multijunction solar cells in Examples 28 and 29 are obtained. Then, the solar cells are evaluated in a similar manner to Example 1.

TABLE 1A

| | Voc V | Jsc mA/cm² | FF | Top cell Conversion efficiency % | Aperture ratio % | Transmittance % |
|---|---|---|---|---|---|---|
| Example 1 | 1.26 | 13.7 | 0.771 | 13.31 | 86 | 75.9 |
| Comparative Example 1 | 1.08 | 13.7 | 0.680 | 10.06 | 100 | 84.9 |
| Example 2 | 1.26 | 13.7 | 0.775 | 13.38 | 85 | 74.3 |
| Example 3 | 1.26 | 13.8 | 0.783 | 13.61 | 85 | 74.3 |
| Example 4 | 1.26 | 13.7 | 0.784 | 13.53 | 85 | 73.6 |
| Example 5 | 1.26 | 13.7 | 0.786 | 13.57 | 84 | 72.0 |
| Example 6 | 1.26 | 13.6 | 0.786 | 13.47 | 84 | 72.0 |
| Example 7 | 1.26 | 13.6 | 0.788 | 13.50 | 86 | 73.0 |
| Example 8 | 1.26 | 13.5 | 0.785 | 13.35 | 85 | 72.2 |
| Example 9 | 1.26 | 13.9 | 0.790 | 13.84 | 56 | 48.5 |
| Example 10 | 1.26 | 13.9 | 0.790 | 13.84 | 62 | 53.7 |
| Example 11 | 1.26 | 13.8 | 0.788 | 13.70 | 72 | 62.4 |
| Example 12 | 1.26 | 13.8 | 0.787 | 13.68 | 81 | 70.1 |
| Example 13 | 1.26 | 13.7 | 0.785 | 13.55 | 86 | 74.5 |
| Example 14 | 1.26 | 13.7 | 0.783 | 13.52 | 92 | 79.7 |
| Example 15 | 1.25 | 13.7 | 0.781 | 13.37 | 94 | 81.4 |
| Example 16 | 1.23 | 13.6 | 0.776 | 12.98 | 97 | 84.0 |
| Example 17 | 1.15 | 13.4 | 0.721 | 11.11 | 99.95 | 86.6 |
| Example 18 | 1.26 | 13.8 | 0.787 | 13.68 | 83 | 72.0 |
| Example 19 | 1.26 | 13.8 | 0.787 | 13.68 | 86 | 74.3 |
| Example 20 | 1.26 | 13.8 | 0.788 | 13.70 | 89 | 77.5 |
| Example 21 | 1.27 | 13.9 | 0.795 | 14.03 | 86 | 74.5 |
| Example 22 | 1.28 | 13.9 | 0.796 | 14.16 | 85 | 73.6 |
| Example 23 | 1.27 | 13.9 | 0.795 | 14.03 | 86 | 74.5 |
| Example 24 | 1.28 | 13.9 | 0.797 | 14.18 | 85 | 73.6 |
| Example 25 | 1.28 | 13.9 | 0.798 | 14.20 | 85 | 73.6 |
| Example 26 | 1.24 | 13.6 | 0.782 | 13.19 | 85 | 73.6 |
| Example 27 | 1.28 | 13.7 | 0.784 | 13.75 | 85 | 73.6 |
| Example 28 | 1.29 | 13.9 | 0.797 | 14.29 | 85 | 73.6 |
| Example 29 | 1.29 | 13.9 | 0.798 | 14.31 | 85 | 73.6 |

TABLE 1B

| | Bottom Cell Conversion efficiency % | Multijunction solar cell Conversion efficiency % |
|---|---|---|
| Example 1 | 13.67 | 26.98 |
| Comparative Example 1 | 15.28 | 25.34 |
| Example 2 | 13.38 | 26.76 |
| Example 3 | 13.38 | 26.99 |
| Example 4 | 13.25 | 26.78 |
| Example 5 | 12.97 | 26.53 |
| Example 6 | 12.97 | 26.43 |
| Example 7 | 13.14 | 26.65 |
| Example 8 | 12.99 | 26.34 |
| Example 9 | 8.73 | 22.57 |
| Example 10 | 9.66 | 23.50 |
| Example 11 | 11.22 | 24.92 |
| Example 12 | 12.63 | 26.31 |
| Example 13 | 13.41 | 26.96 |
| Example 14 | 14.34 | 27.86 |
| Example 15 | 14.65 | 28.03 |
| Example 16 | 15.12 | 28.10 |
| Example 17 | 15.58 | 26.69 |
| Example 18 | 12.96 | 26.64 |
| Example 19 | 13.37 | 27.05 |
| Example 20 | 13.94 | 27.64 |
| Example 21 | 13.41 | 27.44 |
| Example 22 | 13.25 | 27.41 |
| Example 23 | 13.41 | 27.44 |
| Example 24 | 13.25 | 27.43 |
| Example 25 | 13.25 | 27.45 |
| Example 26 | 13.25 | 26.44 |
| Example 27 | 13.25 | 27.00 |

TABLE 1B-continued

| | Bottom Cell Conversion efficiency % | Multijunction solar cell Conversion efficiency % |
|---|---|---|
| Example 28 | 13.25 | 27.54 |
| Example 29 | 13.25 | 27.56 |

As indicated in Table 1, Examples 1 to 29 are superior to Comparative Example 1 in a conversion efficiency as a top cell alone, that is, a solar cell. Furthermore, in a case of use as a multijunction solar cell, the multijunction solar cells in Examples 1 to 8 and 12 to 28 are superior to the multijunction solar cell in Comparative Example 1 in a conversion efficiency. This is because the conversion efficiency is improved because formation of an oxide film is inhibited and an effect of improving an open circuit voltage is exhibited. Meanwhile, the conversion efficiency of each of the multijunction solar cells in Examples 9 to 11 is lower than that in Comparative Example 1. However, it is indicated that use of the top cell (solar cell) of the present embodiment can improve the conversion efficiency even when the conversion efficiency of a bottom cell alone is low.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
a substrate having a light transmitting property;
a first electrode including a plurality of metal portions and having a light transmitting property;
a light absorbing layer disposed on the first electrode and absorbing light; and
a second electrode disposed on the light absorbing layer and having a light transmitting property,
wherein the plurality of metal portions is in direct contact with the light absorbing layer,
at least one part of the plurality of metal portions is separated,
each of the plurality of metal portions has a dot shape,
the plurality of metal portions is not in direct contact with each other,
the plurality of metal portions consist of metal,
a thickness of the plurality of metal portions is 50 nm or more, and wherein the first electrode consists essentially of one or more semiconductor films and the plurality of metal portions, and side surfaces of the plurality of metal portions are each in direct contact with the light absorbing layer and the one or more semiconductor films.

2. The solar cell according to claim 1, wherein the plurality of metal portions is present from a surface on a side of the substrate up to an inside of the light absorbing layer.

3. The solar cell according to claim 1, wherein the plurality of metal portions contains at least one selected from a group consisting of: a metal and an alloy.

4. The solar cell according to claim 1, wherein the plurality of metal portions contains at least one selected from a group consisting of: Mo, Pt, Ir, and Pd.

5. The solar cell according to claim 1, wherein the first electrode is disposed between the substrate and the light absorbing layer.

6. The solar cell according to claim 1, wherein each of the plurality of metal portions is in direct contact with the substrate, and each of the plurality of metal portions is in direct contact with the light absorbing layer.

7. The solar cell according to claim 1, wherein an aperture ratio of is 80% or more and 99.95% or less.

8. The solar cell according to claim 1, wherein a dot diameter of each of the plurality of metal portions is 2 nm or more and 20 μm or less,
   a minimum value and a maximum value of the dot diameters of the metal portions are 0.8 times or more and 1.2 times or less an average value of the dot diameters of the metal portions, and
   a minimum value and a maximum value of an interval between the plurality of metal portions are 0.8 times or more and 1.2 times or less an average value of intervals between the plurality of metal portions.

9. The solar cell according to claim 1, wherein a surface of the substrate facing to the plurality of metal portions is flat.

10. The solar cell according to claim 1, where every metal portion is not in direct contact with each other.

11. The solar cell according to claim 1, wherein the thickness of the plurality of metal portions is 50 nm or more and 300 nm or less.

12. The solar cell according to claim 1, wherein an aperture ratio of the first electrode is 50% or more and 99.95% or less.

13. The solar cell according to claim 12, wherein a first insulating film is present between the first electrode and the light absorbing layer.

14. A multijunction solar cell using the solar cell according to claim 1.

15. A solar cell module using the multijunction solar cell according to claim 14.

16. A solar cell module using the solar cell according to claim 1.

17. A solar power generation system using the solar cell module according to claim 16.

18. The solar cell according to claim 1, wherein the thickness of the plurality of metal portions is equal to or thicker than a thickness of the first electrode.

19. The solar cell according to claim 18, wherein the thickness of the first electrode is 100 nm or more and 1000 nm or less.

* * * * *